(12) United States Patent
Huang et al.

(10) Patent No.: US 9,270,112 B2
(45) Date of Patent: Feb. 23, 2016

(54) DRIVING CIRCUIT

(71) Applicant: Novatek Microelectronics Corp., Hsinchu (TW)

(72) Inventors: Ju-Lin Huang, Hsinchu County (TW); Che-Lun Hsu, Hsinchu County (TW); Jhih-Siou Cheng, New Taipei (TW); Chun-Yung Cho, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 148 days.

(21) Appl. No.: 13/865,210

(22) Filed: Apr. 18, 2013

(65) Prior Publication Data

US 2014/0133058 A1 May 15, 2014

(30) Foreign Application Priority Data

Nov. 14, 2012 (TW) .............................. 101142418 A

(51) Int. Cl.
*H02H 9/02* (2006.01)
*H02H 9/04* (2006.01)
*G09G 3/20* (2006.01)

(52) U.S. Cl.
CPC . *H02H 9/046* (2013.01); *G09G 3/20* (2013.01)

(58) Field of Classification Search
CPC ............ H02H 9/02; H02H 9/046; G09G 3/20
USPC ........................................................... 361/56
See application file for complete search history.

(56) References Cited

U.S. PATENT DOCUMENTS

| 7,193,550 | B2 | 3/2007 | Yamaguchi et al. |
| 7,486,285 | B2 | 2/2009 | Jo et al. |
| 7,884,653 | B2 | 2/2011 | Chen et al. |
| 7,928,954 | B1 | 4/2011 | Chen et al. |
| 8,643,145 | B2 | 2/2014 | Takahashi |
| 2005/0231409 | A1 | 10/2005 | Yamaguchi et al. |
| 2005/0270205 | A1 | 12/2005 | Jo et al. |
| 2006/0017655 | A1* | 1/2006 | Brown et al. ...................... 345/7 |
| 2009/0015297 | A1* | 1/2009 | Chen et al. .................... 327/108 |
| 2009/0115769 | A1 | 5/2009 | Jo et al. |
| 2010/0321370 | A1* | 12/2010 | Weng et al. ................... 345/212 |

(Continued)

FOREIGN PATENT DOCUMENTS

| CN | 1677467 | 10/2005 |
| CN | 1702972 | 11/2005 |
| CN | 102683342 | 9/2012 |

(Continued)

OTHER PUBLICATIONS

"Office Action of Taiwan Counterpart Application", issued on May 30, 2014, p. 1-p. 7.

(Continued)

*Primary Examiner* — Thienvu Tran
*Assistant Examiner* — Kevin J Comber
(74) *Attorney, Agent, or Firm* — Jianq Chyun IP Office

(57) ABSTRACT

A driving circuit includes several first electrostatic current limiting resistors and several digital to analog converter (DAC) units. First ends of these first electrostatic current limiting resistors common coupled to a global path to receive a reference voltage. These DAC units respectively coupled to second ends of the first electrostatic current limiting resistors one-on-one to receive the reference voltage through the first electrostatic current limiting resistors.

9 Claims, 10 Drawing Sheets

(56) References Cited

U.S. PATENT DOCUMENTS

2011/0089979 A1    4/2011    Chen et al.
2012/0228740 A1*  9/2012    Takahashi ..................... 257/536

FOREIGN PATENT DOCUMENTS

| | | |
|---|---|---|
| TW | 241382 | 2/1995 |
| TW | 278721 | 6/1996 |
| TW | 200903432 | 1/2009 |

OTHER PUBLICATIONS

"Office Action of China Counterpart Application", issued on Oct. 28, 2015, p. 1-p. 8, in which the listed references (US application No. 1-2 and Foreign Patent No. 1-4) were cited.

* cited by examiner

DRIVING CIRCUIT

CROSS-REFERENCE TO RELATED APPLICATION

This application claims the priority benefit of Taiwan application serial no. 101142418, filed on Nov. 14, 2012. The entirety of the above-mentioned patent application is hereby incorporated by reference herein and made a part of this specification.

BACKGROUND

1. Field of the Invention

The present invention is directed to a driving circuit and more particularly, to a driving circuit having electrostatic protection capability and capable of reducing an equivalent time constant.

2. Description of Related Art

Typically, the way for a driving circuit to generate driving voltages in an Integrated Circuit (IC) is to directly connect a gamma resistor string to digital-to-analog converters (DACs) to provide the DACs with a plurality of reference voltages, such that the driving voltages are generated by the DACs. Gamma voltages are divided to a plurality of reference voltages required by the internal of the driving circuit using the gamma resistor string, and the reference voltages are transmitted to the corresponding DACs. The DACs converts pixel data to analog signals (driving voltages) according to each of the reference voltages and outputs the analog signals (driving voltages) to an output-stage circuit. The output-stage circuit gains the driving voltages and outputs the gained driving voltages to a display panel.

However, during a process of electrostatic discharge test, manufacturing, or usage of the IC, an over large electrostatic energy is commonly produced and flows in the internal of the driving circuit IC. If such electrostatic energy is not vented by an adaptive electrostatic discharge protection circuit, elements thereof may be damaged or even worse, the IC may be directly burned, which results in a demand of electrostatic discharge protection to improve the protection capability for resisting the electrostatic.

SUMMARY

The present invention is directed to a driving circuit capable of protecting electrostatic discharge and reducing the equivalent time constant of a circuit.

According to an embodiment of the present invention, a driving circuit including a plurality of first electrostatic current limiting resistors and a plurality of digital-to-analog converter (DAC) units is provided. First ends of the first electrostatic current limiting resistors are commonly coupled to a global path to receive a reference voltage. The DAC units are respectively coupled to second ends of the first electrostatic current limiting resistors in a one-on-one manner to respectively receive the reference voltage through the first electrostatic current limiting resistors.

In an embodiment of the present invention, each of the DAC units is a single digital-to-analog converter.

In an embodiment of the present invention, the digital-to-analog converters of the DAC units have the same resistance value.

In another embodiment of the present invention, each of the DAC units is a digital-to-analog converter group including a plurality of digital-to-analog converters. The digital-to-analog converters belonging to the same digital-to-analog converter group are commonly coupled to a second end of one electrostatic current limiting resistor among the first electrostatic current limiting resistors.

In another embodiment of the present invention, the digital-to-analog converter groups have the same resistance value.

In an embodiment of the present invention, the first electrostatic current limiting resistors have the same resistance value.

In an embodiment of the present invention, the driving circuit further includes a second electrostatic current limiting resistor. The second electrostatic current limiting resistor is configured on the global path and coupled to the first ends of the first electrostatic current limiting resistors.

In an embodiment of the present invention, the second electrostatic current limiting resistor has a resistance value smaller than the resistance value of the first electrostatic current limiting resistors.

In an embodiment of the present invention, the driving circuit further includes a gamma resistor string having a plurality of voltage-dividing nodes to divide a gamma voltage to N reference voltages, wherein one of the voltage-dividing nodes is coupled to the first ends of the first electrostatic current limiting resistors through the global path.

In an embodiment of the present invention, the driving circuit further includes a bonding pad, wherein the bonding pad and the first ends of the first electrostatic current limiting resistors are commonly coupled to the one of the voltage-dividing nodes.

In an embodiment of the present invention, the driving circuit further includes an output-stage circuit coupled to output terminals of the DAC units. The DAC units drive a display panel through the output-stage circuit.

To sum up, the present invention is directed to a driving circuit having electrostatic discharge protection capability and can achieve reducing the equivalent time constant without lowing down the electrostatic discharge protection capability.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
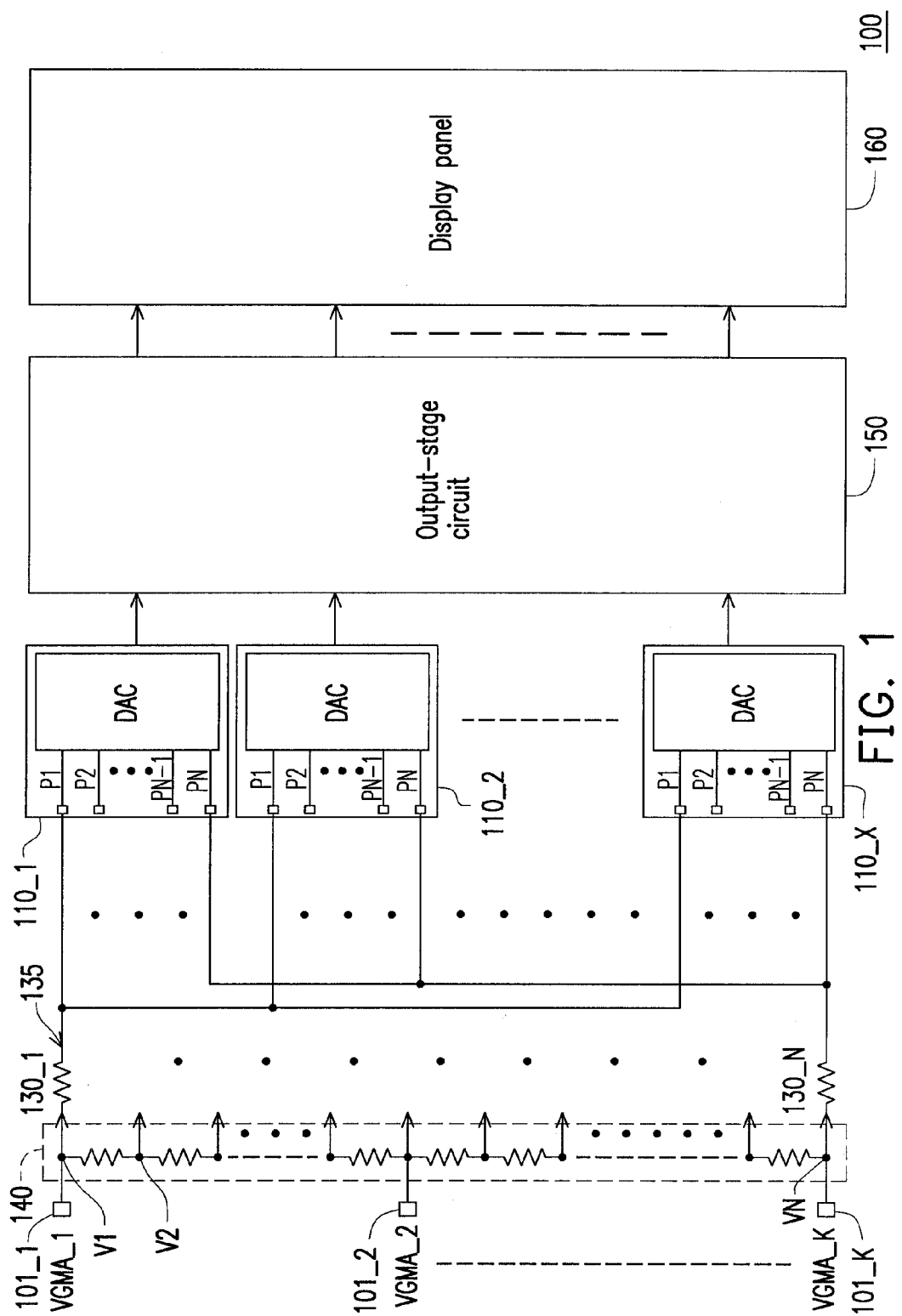
FIG. 1 is a schematic diagram illustrating a driving circuit having electrostatic protection capability according to an embodiment of the present invention.

FIG. 1 is a schematic diagram illustrating a driving circuit having electrostatic protection capability according to an embodiment of the present invention. Referring to FIG. 1, a driving circuit 100 includes a plurality of electrostatic current limiting resistors (e.g. 130_1, . . . and 130_N), a plurality of digital-to-analog converter (DAC) units (e.g. 110_1, 110_2, . . . and 110_X), a gamma resistor string 140 and an output-stage circuit 150. In the present embodiment, each of the DAC units 110_1~110_X is a single digital-to-analog converter, wherein X is an amount of the DAC units, and N is an amount of voltage-dividing nodes in the gamma resistor string 140.

Continuously referring to FIG. 1, the driving circuit 100 includes one or more bonding pads for receiving one or more gamma voltages from the external of an integrated circuit (IC). For example, FIG. 1 illustrates K bonding pads 101_1, 101_2, . . . and 101_K used for receiving K gamma voltages VGMA_1, VGMA_2, . . . and VGMA_K from the external of the IC. The gamma resistor string 140 includes a plurality of voltage-dividing nodes V1, V2, . . . and VN as shown in FIG. 1. A portion of the voltage-dividing nodes V1~VN are connected to the bonding pads 101_1~101_K so as to receive the gamma voltages VGMA_1~VGMA_K from the bonding pads 101_1~101_K. For instance, the bonding pad 101_1 is coupled to the voltage-dividing node V1 of the gamma resistor string 140, and the bonding pad 101_K is coupled to the voltage-dividing node VN of the gamma resistor string 140. The voltage-dividing nodes V1~VN divides the gamma voltages VGMA_1~VGMA_K to N reference voltages. In order to be clean and simple, only the voltage-dividing nodes V1 and VN are illustrated for description, but the present invention is not limited thereto. The coupling relationship between the other voltage-dividing nodes and the DAC units 110_1~110_X may be inferred with reference to the description related to the voltage-dividing nodes V1 and VN, likewise.

First ends of the electrostatic current limiting resistors 130_1~130_N are respectively coupled to their corresponding voltage-dividing nodes V1~VN. For example, as illustrated in FIG. 1, the first end of the electrostatic current limiting resistor 130_1 is coupled to the voltage-dividing nodes V1. Likewise, the first end of the electrostatic current limiting resistor 130_N is coupled to the voltage-dividing node VN.

Each of the DAC units 110_1~110_X has N reference voltage input terminals P1, P2, . . . and PN-1 and PN used for receiving a plurality of reference voltages required by a "digital-to-analog conversion" operation. The input terminals P1~PN are respectively coupled to the second ends of the electrostatic current limiting resistors 130_1~130_N so as to receive the reference voltages of different levels through the electrostatic current limiting resistors 130_1~130_N. For instance, the terminal P1 of each of the DAC units 110_1~110_X is commonly coupled to the second end of the electrostatic current limiting resistor 130_1 in the global path 135 and receives the reference voltage of the voltage-dividing node V1 through the electrostatic current limiting resistor 130_1. Likewise, the input terminal PN of each of the DAC units 110_1~110_X is commonly coupled to the second end of the electrostatic current limiting resistor 130_N in another global path and receives the reference voltage of the voltage-dividing nodes VN through the electrostatic current limiting resistor 130_N.

The output-stage circuit 150 is coupled to the output terminals of the DAC units 110_1~110_X. The DAC units 110_1~110_X outputs driving voltages to a display panel 160 through the output-stage circuit 150 so as to drive different data lines of the display panel 160.

In the present embodiment, an electrostatic current limiting resistor (e.g. the electrostatic current limiting resistor 130_1) is disposed on a global path (e.g. the global path 135) so as to reduce electrostatic discharge voltages or electrostatic discharge voltages received by the DAC units 110_1~110_X. The electrostatic current limiting resistors 130_1~130_N may limit each electrostatic current generated during a electrostatic testing, a manufacturing, or a usage process in the driving circuit so as to achieve the electrostatic discharge protection. However, the increase of the electrostatic current limiting resistors 130_1-130N results in an increase of an equivalent resistance value R in the circuit, so that a time constant τ (τ=R*C) of the driving circuit becomes greater. Therein, C represents a capacitance value of the circuit. The greater time constant τ leads to a slower state conversion of the driving circuit 100.

Figure 2:
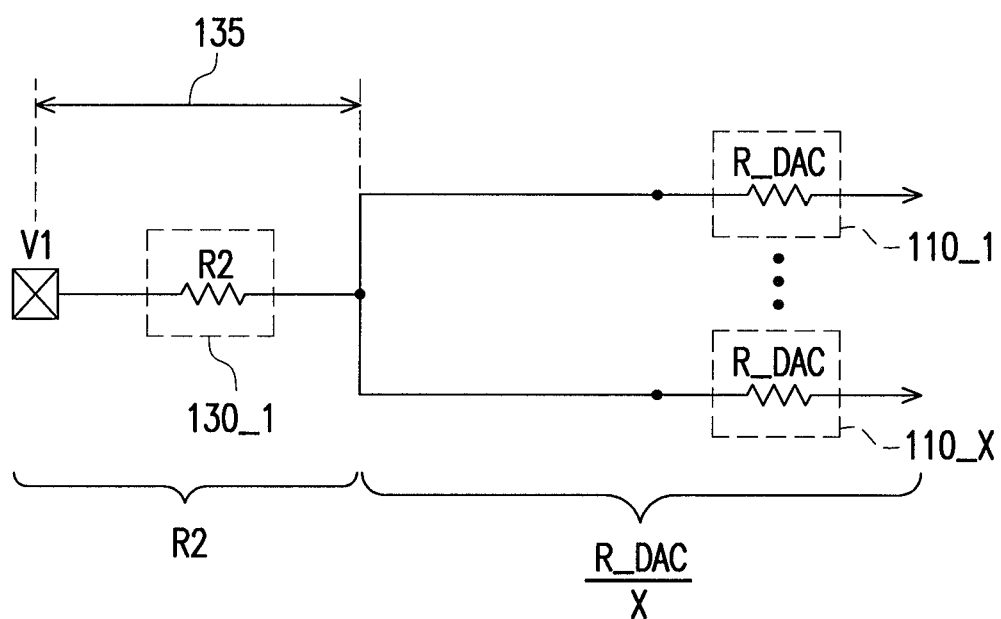
FIG. 2 is a schematic diagram illustrating a part of an equivalent circuit of the driving circuit 100 depicted in FIG. 1.

FIG. 2 is a schematic diagram illustrating a part of an equivalent circuit of the driving circuit 100 depicted in FIG. 1. In the present embodiment, referring to FIG. 2 with FIG. 1, it is assumed that the DAC units 110_1~110_X have the digital-to-analog converters in the same specifications and have the same resistance value. It is also assumed that input impedances of the input terminals P1~PN of each of the DAC units 110_1~110_X are R_DAC. Thus, as for the voltage-dividing node V1 and the global path 135, if each of the DAC units 110_1~110_X has the resistance value of R_DAC, an equivalent resistance of each of the DAC units 110_1~110_X is R_DAC/X. Further, it is assumed that an equivalent resistance value of the electrostatic current limiting resistor 130_1 is R2. Accordingly, a total equivalent resistance value R obtained between the voltage-dividing node V1 and the output-stage circuit 150 is R_DAC/X+R2. In order to effectively limit the electrostatic discharge current flowing through the electrostatic current limiting resistor 130_1, the equivalent resistance value R2 of the electrostatic current limiting resistor 130_1 has to be great enough. Therefore, the equivalent resistance value R2 of the electrostatic current limiting resistor 130_1 causes the increase of the equivalent time constant τ(τ=R*C) and results in a slower state conversion output (or a response time) of the driving circuit 100.

Figure 3:
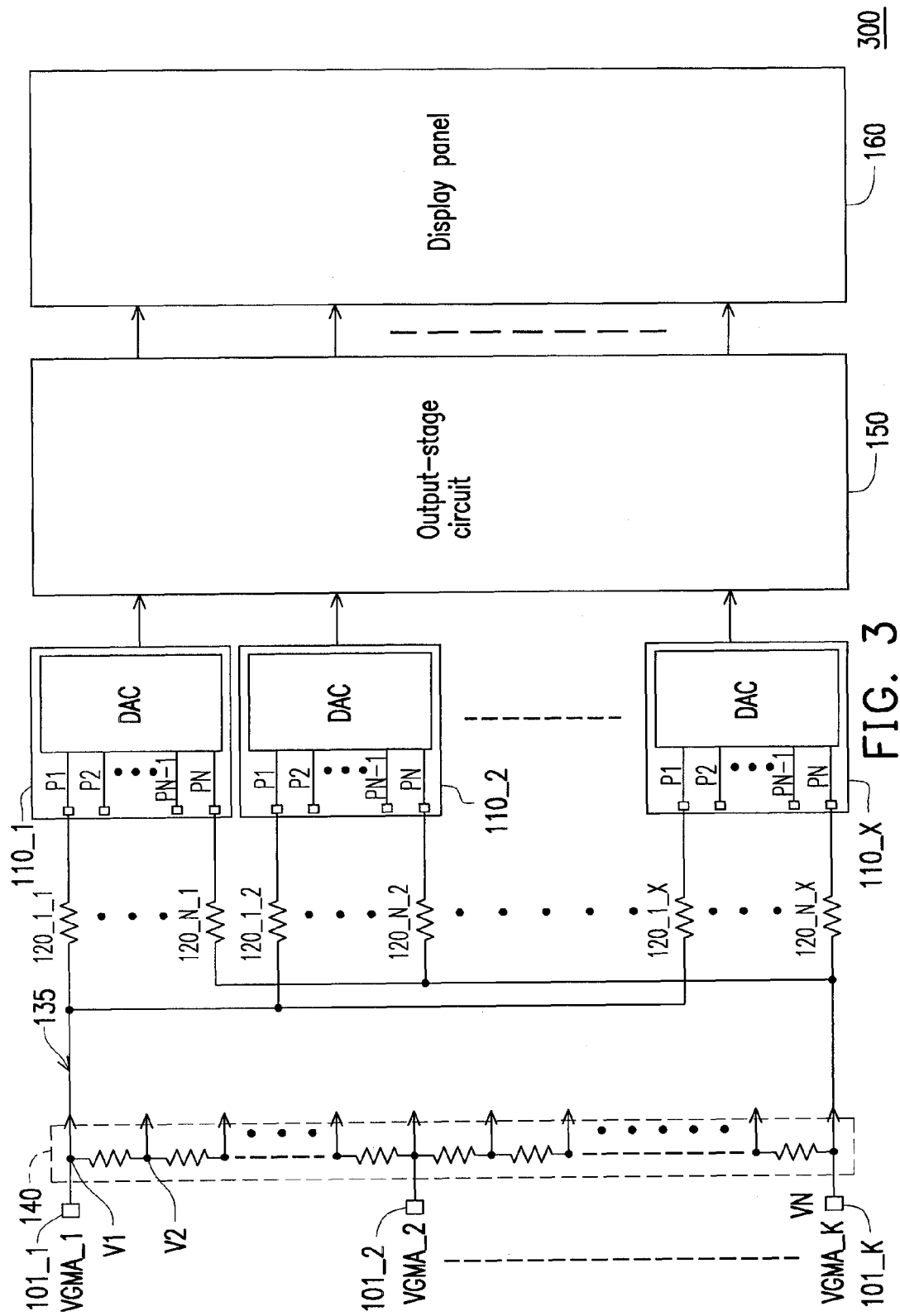
FIG. 3 is a schematic diagram illustrating a driving circuit according to a first embodiment of the present invention.

FIG. 3 is a schematic diagram illustrating a driving circuit according to a first embodiment of the present invention. The embodiment illustrated in FIG. 3 may be inferred with reference to the description related to the embodiment illustrated in FIG. 1, likewise. Referring to FIG. 3, a driving circuit 300 includes a plurality of first electrostatic current limiting resistors (e.g. 120_1_1, 120_1_2, . . . and 120_1_X and 120_N_1, 120_N_2, . . . and 120_N_X), a plurality of DAC units (e.g. 110_1~110_X), a gamma resistor string 140 and an output-stage circuit 150. In the present embodiment, each of the DAC units 110_1~110_X is a single digital-to-analog converter, wherein X is an amount of the DAC units, and N is an amount of voltage-dividing nodes in the gamma resistor string 140.

Continuously referring to FIG. 3, the driving circuit 300 includes one or more bonding pads for receiving one or more gamma voltages from the external of IC. For example, FIG. 3 illustrates K bonding pads 101_1, 101_2, ... and 101_K used for receiving K gamma voltages VGMA_1, VGMA_2, ... and VGMA_K from the external of the IC. The gamma resistor string 140 includes a plurality of voltage-dividing nodes V1, V2, ... and VN to divide the gamma voltages VGMA_1~VGMA_K to N reference voltages as shown in FIG. 3. A portion of the voltage-dividing nodes V1~VN are connected to the bonding pads 101_1~101_K so as to receive the gamma voltages VGMA_1~VGMA_K from the bonding pads 101_1~101_K. For instance, the bonding pad 101_1 is coupled to the voltage-dividing node V1 of the gamma resistor string 140, and the bonding pad 101_K is coupled to the voltage-dividing node VN of the gamma resistor string 140. In order to be clean and simple, only the voltage-dividing nodes V1 and VN are illustrated for description, but the present invention is not limited thereto. The coupling relationship between the other voltage-dividing nodes and the DAC units 110_1~110_X may be inferred with reference to the description related to the voltage-dividing nodes V1 and VN, likewise.

As shown in FIG. 3, the first ends of the electrostatic current limiting resistors 130_1~130_N are commonly coupled to the global path and the voltage-dividing nodes V1~VN corresponding thereto. For example, first ends of first electrostatic current limiting resistors 120_1_1~120_1_X are commonly coupled to the voltage-dividing node V1 in the gamma resistor string 140 through the global path 135. Likewise, the first ends of the first electrostatic current limiting resistors 120_N_1~120_N_X are commonly coupled to the voltage-dividing nodes VN in the gamma resistor string 140 through another global path.

Each of the DAC units 110_1~110_X has N reference voltage input terminals P1, P2, ... and PN-1 and PN. The input terminals P1~PN are respectively coupled to second ends of the first electrostatic current limiting resistors 120_1_1~120_1_X, 120_N_1~120_N_X to receive reference voltages of different levels through the corresponding electrostatic current limiting resistors 130_1~130_N. For example, the input terminal P1 of each of the DAC units 110_1~110_X is coupled to a corresponding second end of each of the first electrostatic current limiting resistors 120_1_1~120_1_X in a one-on-one manner to so as to receive a reference voltage of the voltage-dividing node V1 through each of the first electrostatic current limiting resistors 120_1_1~120_1_X. For instance, the terminal P1 of the DAC unit 110_1 is coupled to the first electrostatic current limiting resistor 120_1_1 and receives the reference voltage of the voltage-dividing node V1 through the first electrostatic current limiting resistor 120_1_1, the input terminal P1 of the DAC unit 110_2 is coupled to the first electrostatic current limiting resistors 120_1_2 and receives the reference voltage of the voltage-dividing node V1 through the first electrostatic current limiting resistor 120_1_2, and the input terminal P1 of the DAC unit 110_X is coupled to the first electrostatic current limiting resistors 120_1_X and receives the reference voltage of the voltage-dividing nodes V1 through the first electrostatic current limiting resistors 120_1x. Likewise, the input terminal PN of each of the DAC units 110_1~110_X is coupled to the corresponding second end of each of the first electrostatic current limiting resistors 120_N_1~120_N_X in the one-on-one manner and receives the reference voltage of the voltage-dividing node VN through each of the first electrostatic current limiting resistors 120_N_1~120_N_X.

The output-stage circuit 150 is coupled to the output terminals of the DAC units 110_1~110_X. The DAC units 110_1~110_X drive different data lines of the display panel 160 through the output-stage circuit 150.

Figure 4:
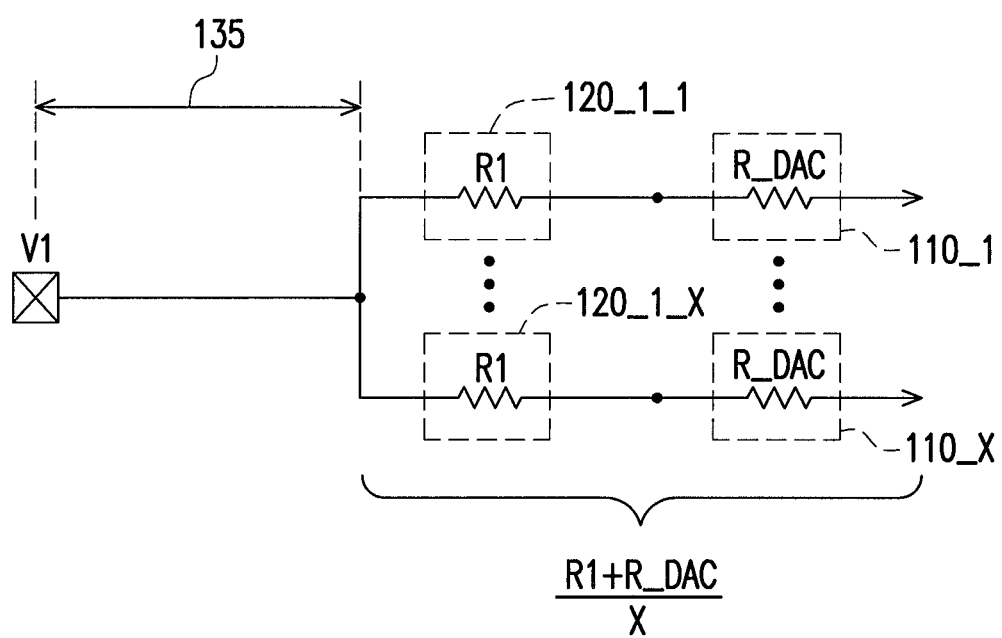
FIG. 4 is a schematic diagram illustrating a part of an equivalent circuit of the driving circuit 300 depicted in FIG. 3.

FIG. 4 is a schematic diagram illustrating a part of an equivalent circuit of the driving circuit 300 depicted in FIG. 3. In the present embodiment, referring to FIG. 4 with FIG. 3, each of the DAC units 110_1~110_X is a digital-to-analog converter and has the same resistance value. Here, it is assumed that the input impedances of the input terminals P1~PN of each of the DAC units 110_1~110_X are R_DAC. It is also assumed that a resistance value of each of the first electrostatic current limiting resistors 120_1_1~120_1_X is R1. Accordingly, a total equivalent resistance value obtained between the voltage-dividing node V1 and the output-stage circuit 150 is (R1+R_DAC)/X. Comparing with the total equivalent resistance value R_DAC/X+R2 in the embodiment illustrated in FIG. 1, in the present embodiment, if it is assumed that R1=R2, the total equivalent resistance value of the electrostatic current limiting resistors 120_1_1~120_1_X may be reduced by X times. Thus, without reducing the electrostatic discharge protection capability, the equivalent resistance value of each of the first electrostatic current limiting resistors 120_1_1~120_1_X in the present embodiment may be reduced down to R1/X so as to reduce the equivalent time constant $\tau$ ($\tau$=R*C), wherein C represents the equivalent capacitance of the circuit, which results in a faster state conversion output of the driving circuit 300.

Figure 5:
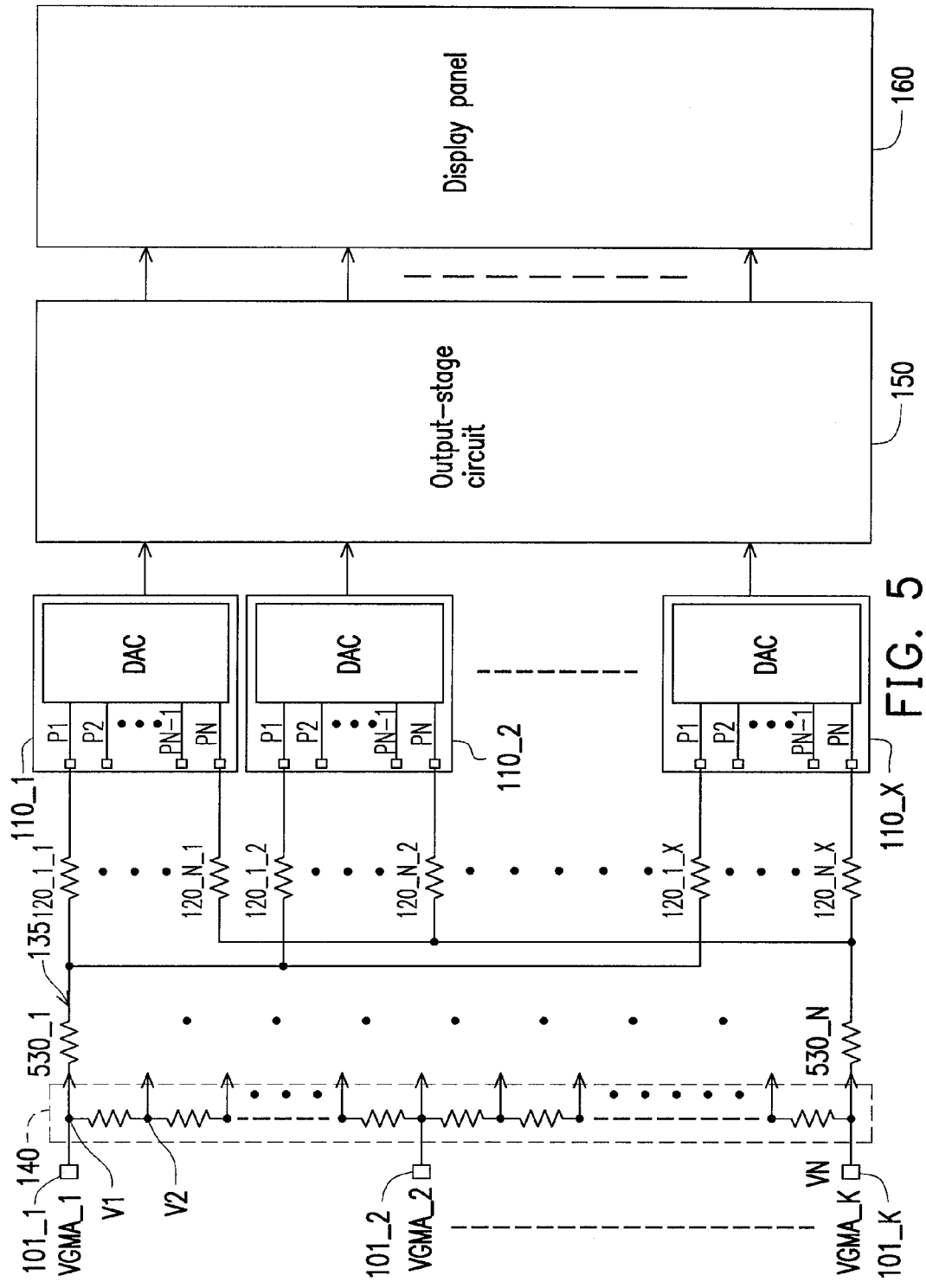
FIG. 5 is a schematic diagram illustrating a driving circuit according to a second embodiment of the present invention.

FIG. 5 is a schematic diagram illustrating a driving circuit according to a second embodiment of the present invention. The embodiment illustrated in FIG. 5 may be inferred with reference to the descriptions related to the embodiments illustrated in FIG. 1 and FIG. 3, likewise. Referring to FIG. 5, a driving circuit 500 includes a plurality of first electrostatic current limiting resistors (e.g. 120_1_1~120_1_X and 120_N_1~120_N_X, a plurality of DAC units (e.g. 110_1~110_X), a gamma resistor string 140, and output-stage circuit 150 and a plurality of second electrostatic current limiting resistors (e.g. 530_1, ... and 530_N) In the present embodiment, each of the DAC units 110_1~110_X is a single digital-to-analog converter, wherein X is an amount of the DAC units, and N is an amount of voltage-dividing nodes in the gamma resistor string 140.

Continuously referring to FIG. 5, the driving circuit 500 includes one or more bonding pads for receiving one or more gamma voltages from the external of the IC. For example, FIG. 5 illustrates K bonding pads 101_1, 101_2, ... and 101_K used for receiving K gamma voltages VGMA_1, VGMA_2, ... and VGMA_K from the external of the IC. The gamma resistor string 140 includes a plurality of voltage-dividing nodes V1, V2, ... and VN to divide the gamma voltages VGMA_1~VGMA_K to N reference voltages as shown in FIG. 5. A portion of the voltage-dividing nodes V1~VN are connected to the bonding pads 101_1~101_K so as to receive the gamma voltages VGMA_1~VGMA_K from the bonding pads 101_~101_K. For instance, the bonding pad 101_1 is coupled to the voltage-dividing node V1 of the gamma resistor string 140, and the bonding pad 101_K is coupled to the voltage-dividing node VN of the gamma resistor string 140. In order to be clean and simple, only the voltage-dividing nodes V1 and VN are illustrated for description, but the present invention is not limited thereto. The coupling relationship between the other voltage-dividing nodes and the DAC units 110_1~110_X may be inferred with reference to the description related to the voltage-dividing nodes V1 and VN, likewise.

The second electrostatic current limiting resistors 530_1~530_N are respectively disposed on different global paths. For example, the second electrostatic current limiting resistor 530_1 is disposed on the global path 135, while the second electrostatic current limiting resistor 530_N is disposed on another global path. First ends of the second electrostatic current limiting resistors 530_~530_N are respectively coupled to the voltage-dividing nodes V1~VN corresponding thereto. For example, as shown in FIG. 5, the first end of the second electrostatic current limiting resistor 530_1 is coupled to voltage-dividing node V1 of the gamma resistor string 140. Likewise, the first end of the second electrostatic current limiting resistor 530_N is coupled to the voltage-dividing node VN of the gamma resistor string 140.

Second ends of the second electrostatic current limiting resistors 530_~530_N are respectively coupled to the first ends of the first electrostatic current limiting resistors. For example, the first ends of the first electrostatic current limiting resistors 120_1_1~120_1_X are commonly coupled to the second ends of the second electrostatic current limiting resistor 530_1. Likewise, the first ends of the first electrostatic current limiting resistors 120_N_1~120_N_X are commonly coupled to the second ends of the second electrostatic current limiting resistor 530_N.

Each of the DAC units 110_1~110_X has N reference voltage input terminals P1, P2, . . . and PN-1 and PN for receiving different reference voltages. The input terminals P1~PN are respectively coupled to the second ends of the first electrostatic current limiting resistors 120_1_1~120_1_X, . . . and 120_N_1~120_N_X to receive reference voltages of different levels. For example, the input terminal P1 of each of the DAC units 110_1~110_X is coupled to the corresponding second end of each of the first electrostatic current limiting resistors in the one-on-one manner so as to receive the reference voltage of the voltage-dividing node V1 through the first electrostatic current limiting resistors 120_1_1~120_1_X, respectively. Likewise, the input terminal PN of each of the DAC units 110_1~110_X is coupled to the corresponding second end of each of the first electrostatic current limiting resistors 120_N_1~120_N_X in the one-on-one manner so as to receive the reference voltage of the voltage-dividing node VN through each of the first electrostatic current limiting resistors 120_N_1, 120_N_2, . . . and 120_N_X.

Figure 6:
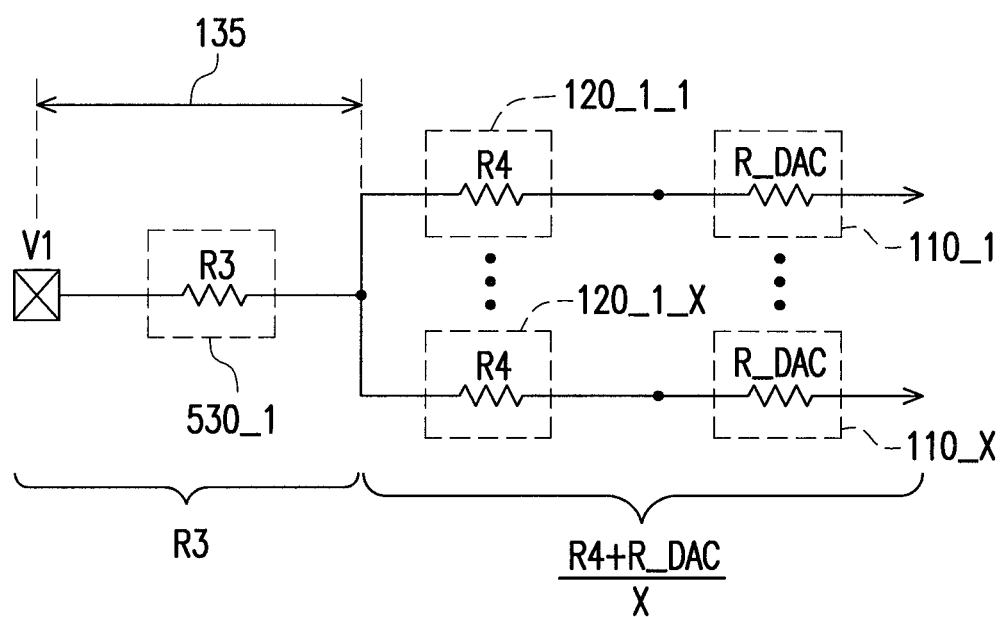
FIG. 6 is a schematic diagram illustrating a part of an equivalent circuit of the driving circuit 500 depicted in FIG. 5 according to the second embodiment.

FIG. 6 is a schematic diagram illustrating a part of an equivalent circuit of the driving circuit 500 depicted in FIG. 5 according to the second embodiment. In the present embodiment, referring to FIG. 6 with FIG. 5, each of the DAC units 110_1~110_X is a digital-to-analog converter and has the same resistance value. Here, it is assumed that the input impedances of the input terminals P1~PN of each of the DAC units 110_1~110_X are R_DAC. It is also assumed that a resistance value of each of the second electrostatic current limiting resistor 530_1 on the global path 135 is R3, and a resistance value of each of the first electrostatic current limiting resistors 120_1_1~120_1_X is R4. Accordingly, a total equivalent resistance value R between the voltage-dividing nodes V1 and the output-stage circuit 150 is R3+(R4+R_DAC)/X. Therein, the resistance value R4 is greater than the resistance value R3, while the resistance value R3 may be as small as possible. Comparing with the total equivalent resistance value R_DAC/X+R2 in the embodiment illustrated in FIG. 1, if it is assumed that (R3+R4)=R2, the total equivalent resistance value R of the present embodiment may be effectively reduced. Thus, without reducing the electrostatic discharge protection capability, the total equivalent resistance value of the of the first electrostatic current limiting resistors 120_1_1~120_1_X and the second electrostatic current limiting resistor 530_1 in the present embodiment may be reduced so as to reduce the equivalent time constant τ (τ=R*C), which results in a faster state conversion output of the driving circuit 300.

Figure 7:
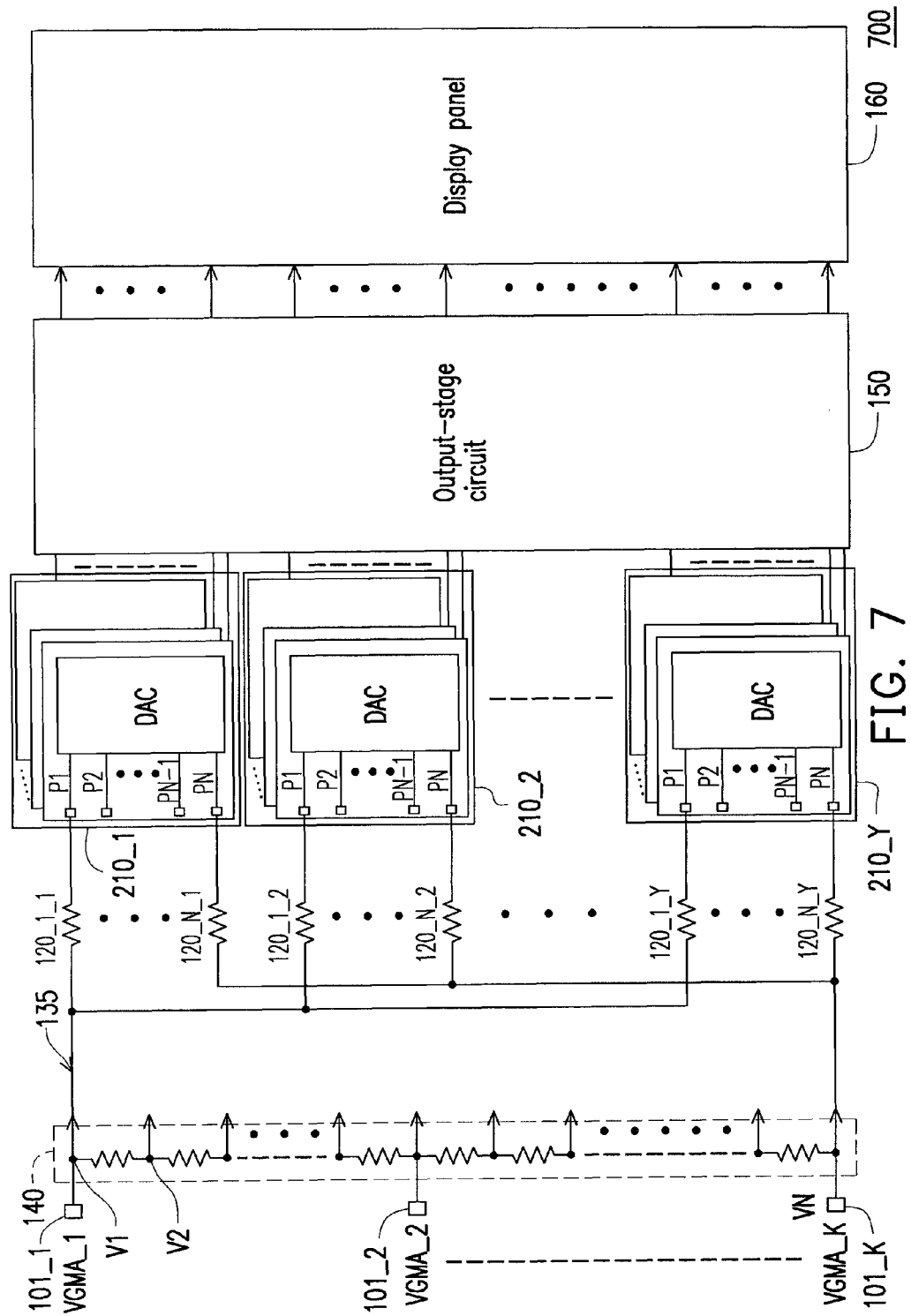
FIG. 7 is a schematic diagram illustrating a driving circuit according to a third embodiment of the present invention.

FIG. 7 is a schematic diagram illustrating a driving circuit according to a third embodiment of the present invention. The embodiment illustrated in FIG. 7 may be inferred with reference to the descriptions related to the embodiments illustrated in FIG. 1, FIG. 3 and FIG. 5, likewise. Referring to FIG. 7, a driving circuit 700 includes a plurality of first electrostatic current limiting resistors (e.g. 120_1_1, 120_1_2, . . . and 120_1_Y and 120_N_1, 120_N_2, . . . and 120_N_Y), a plurality of DAC units (e.g. 210_1, 210_2, . . . and 210_Y), a gamma resistor string 140 and an output-stage circuit 150. In the present embodiment, each of the DAC units 210_1~210_Y is a digital-to-analog converter group composed of X/Y digital-to-analog converters, wherein Y is an amount of the digital-to-analog converter groups, X is an amount of the digital-to-analog converters, and N is an amount of voltage-dividing nodes in the gamma resistor string 140.

Continuously referring to FIG. 7, the driving circuit 700 includes one or more bonding pads for receiving one or more gamma voltages from the external of the IC. For example, FIG. 7 illustrates K bonding pads 101_1, 101_2, . . . and 101_K used for receiving K gamma voltages VGMA_1, VGMA_2, . . . and VGMA_K from the external of the IC. The gamma resistor string 140 includes a plurality of voltage-dividing nodes V1~VN to divide the gamma voltages VGMA_1~VGMA_K to N reference voltages as shown in FIG. 7. A portion of the voltage-dividing nodes V1~VN are connected to the bonding pads bonding pads 101_1~101_K so as to receive the gamma voltages VGMA_1~VGMA_K from the bonding pads 101_1~101_K. For instance, the bonding pad 101_1 is coupled to the voltage-dividing node V1 of the gamma resistor string 140, and the bonding pad 101_K is coupled to the voltage-dividing node VN of the gamma resistor string 140. In order to be clean and simple, only the voltage-dividing nodes V1 and VN are illustrated for description, but the present invention is not limited thereto. The coupling relationship between the other voltage-dividing nodes and the DAC units 110_1~110_X may be inferred with reference to the description related to the voltage-dividing nodes V1 and VN, likewise.

First end of the first electrostatic current limiting resistors are coupled to the corresponding voltage-dividing nodes V1~VN. For example, as shown in FIG. 7, the first ends of the first electrostatic current limiting resistors 120_1_1~120_1_Y are commonly coupled to the voltage-dividing node V1, and likewise, the first ends of the first electrostatic current limiting resistors 120_N_1~120_N_Y are commonly coupled to the voltage-dividing node VN.

Each of the digital-to-analog converters in one of the DAC units 210_1~210_Y has N reference voltage input terminals P1, P2, . . . and PN-1 and PN for receiving different reference voltages. The input terminals P1~PN are respectively coupled to the second ends of the corresponding first electrostatic current limiting resistors to receive reference voltages of different levels. For example, the input terminal P1 of each of the digital-to-analog converters in the DAC unit 210_1 is commonly coupled to the second end of the first electrostatic current limiting resistor 120_1_1 for receiving the reference voltage of the voltage-dividing node V1. Likewise, the input terminal PN of each of the digital-to-analog converters in the DAC unit 210_1 is commonly coupled to the second end of the first electrostatic current limiting resistor 120_N_1 for receiving the reference voltage of the voltage-dividing node voltage-dividing node VN. Further, the input terminal P1 of each of the digital-to-analog converters in the DAC unit 210_Y is commonly coupled to the second end of the first electrostatic current limiting resistor 120_1Y for receiving the reference voltage of the voltage-dividing node V1. Likewise, the input terminal PN of each of the digital-to-analog converters in the DAC unit 210_Y is commonly coupled to the second end of the first electrostatic current limiting resistor 120_NY for receiving the reference voltage of the voltage-dividing node VN. The coupling manner of the other DAC units (such as 210_2) may be inferred with reference to the related description of the DAC units 210_1 and 210_Y in the above and will no longer repeated hereinafter. Therefore, the DAC units receive the reference voltages of the voltage-dividing nodes V1~VN through the first electrostatic current limiting resistors 120_1_1~120_1_Y, and 120_N_1~120_N_Y, respectively.

The output-stage circuit 150 is coupled to the output terminals of all the digital-to-analog converters in the DAC units 210_1~210_Y. The DAC units 210_1~210_Y output driving voltages to the display panel 160 through the output-stage circuit 150 so as to drive different data lines of the display panel 160.

Figure 8:
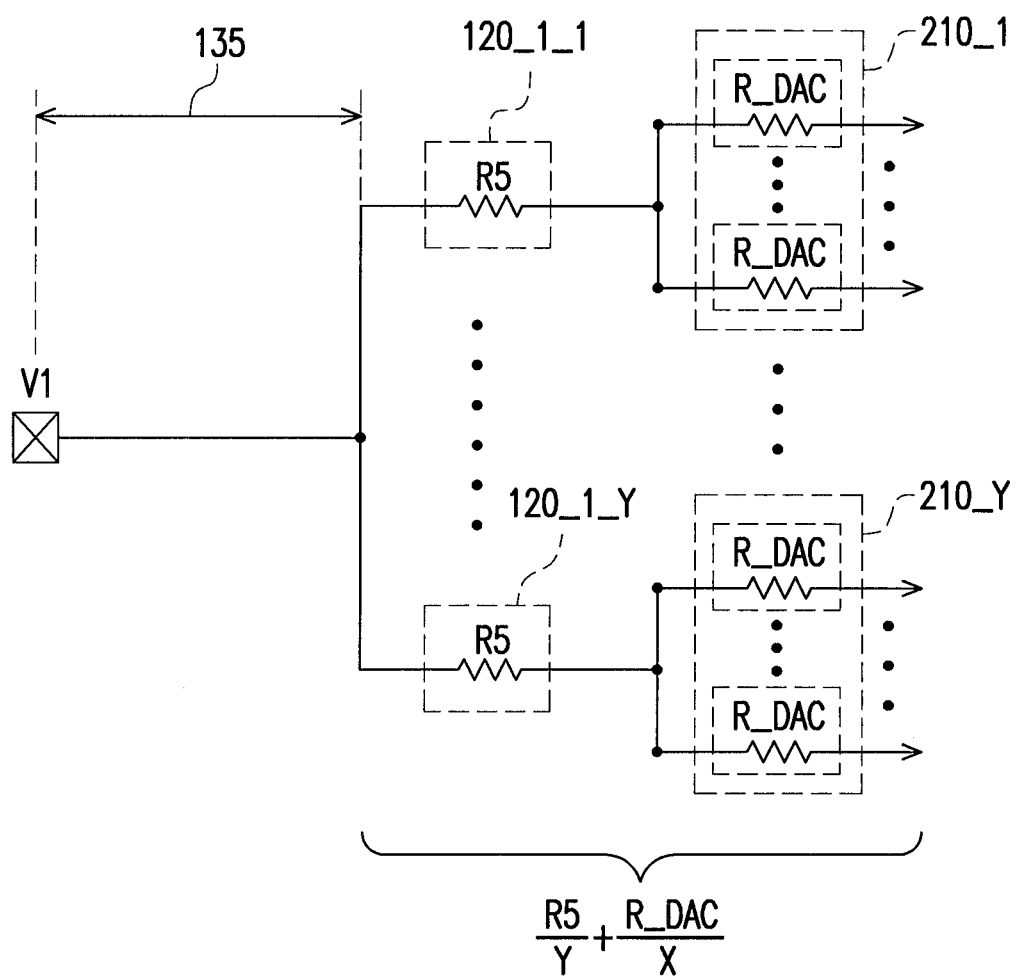
FIG. 8 is a schematic diagram illustrating a part of an equivalent circuit of the driving circuit 700 depicted in FIG. 7 according to the third embodiment.

FIG. 8 is a schematic diagram illustrating a part of an equivalent circuit of the driving circuit 700 depicted in FIG. 7 according to the third embodiment. Referring to FIG. 8 with FIG. 7, each of the DAC units 210_1~210_Y is a digital-to-analog converter group composed of X/Y digital-to-analog converters, and the X/Y digital-to-analog converters have the same resistance value. Here, it is assumed that an input impedance of the input terminal P1~PN of each of the digital-to-analog converters is R_DAC. Thus, the input impedance of each of the DAC units (e.g. 210_1 or 210_Y) is R_DAC*Y/X. Further, it is assumed that each of the first electrostatic current limiting resistors 120_1_1~120_1_Y has a resistance value of R5. Accordingly, a total equivalent resistance value R obtained between the voltage-dividing nodes V1 and the output-stage circuit 150 is R_DAC/X+R5/Y. Comparing with the total equivalent resistance value R_DAC/X+R2 in the embodiment illustrated in FIG. 1, in the present embodiment, if it is assumed that R5=R2, the total equivalent resistance value of the electrostatic current limiting resistors 120_1_1~120_1_Y may be reduced by Y times. Thus, without reducing the electrostatic discharge protection capability, the equivalent resistance value of each of the first electrostatic current limiting resistors 120_1_1~120_1_Y in the present embodiment may be reduced down to R5/Y so as to reduce the equivalent time constant τ (τ=R*C), wherein C represents the equivalent capacitance of the circuit, which results in a faster state conversion output of the driving circuit 700.

Figure 9:
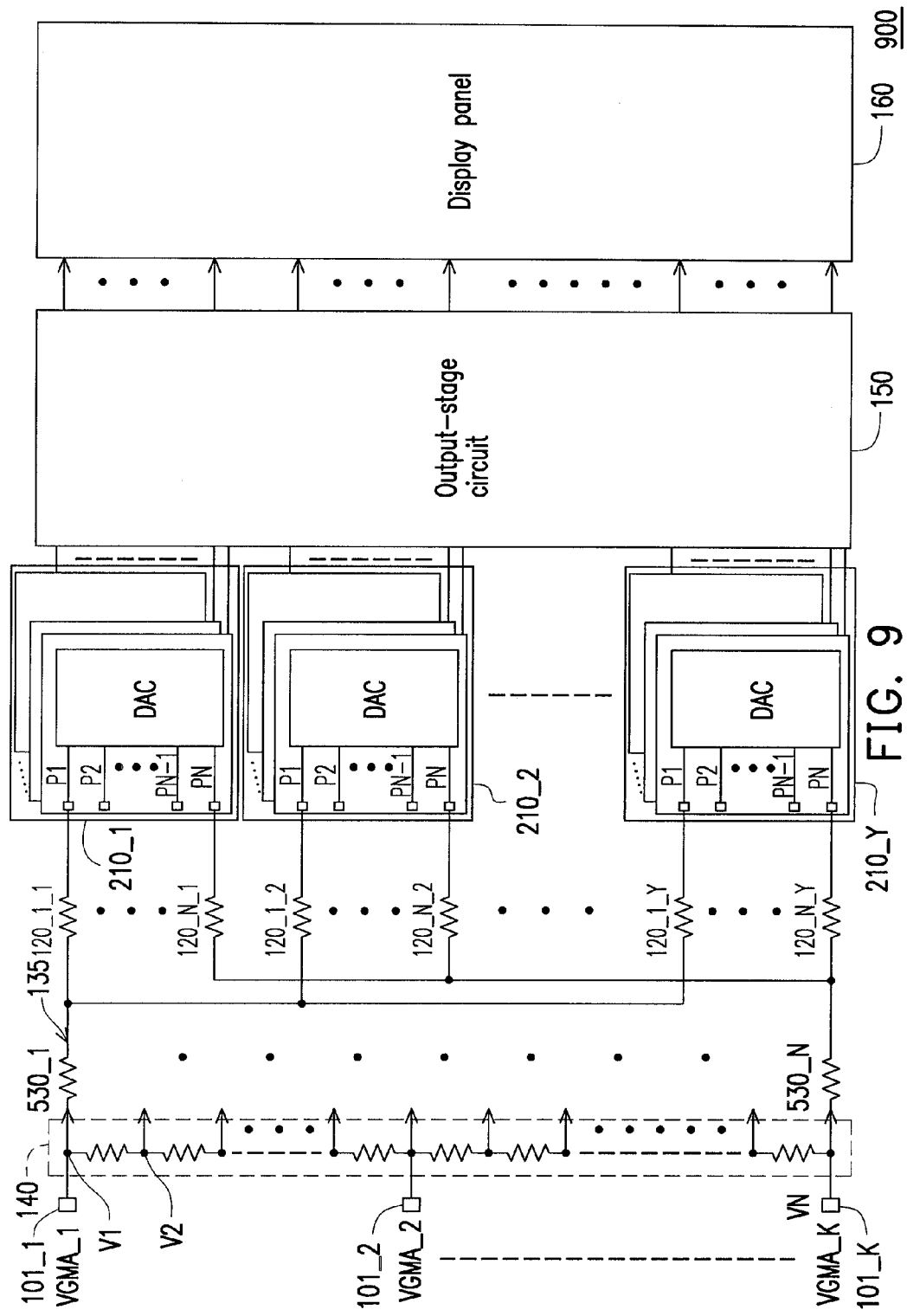
FIG. 9 is a schematic diagram illustrating a driving circuit according to a fourth embodiment of the present invention.

FIG. 9 is a schematic diagram illustrating a driving circuit according to a fourth embodiment of the present invention. The embodiment illustrated in FIG. 9 may be inferred with reference to the descriptions related to the embodiments illustrated in FIG. 1, FIG. 3, FIG. 5 and FIG. 7, likewise. Referring to FIG. 9, a driving circuit 900 includes a plurality of first electrostatic current limiting resistors ((e.g. 120_1_1, 120_1_2, . . . and 120_1_Y or 120_N_1~120_N_2 and 120_N_Y), a plurality of DAC units (e.g. 210_1, 210_2, . . . and 210_Y), a gamma resistor string 140, output-stage circuit 150 and a second electrostatic current limiting resistor (e.g. 530_1, . . . or 530_N). In the present embodiment, each of the DAC units 210_1_210_Y is a digital-to-analog converter group composed of X/Y digital-to-analog converters, wherein Y is an amount of the digital-to-analog converter groups, X is an amount of the digital-to-analog converters, and N is an amount of voltage-dividing nodes in the gamma resistor string 140.

Continuously referring to FIG. 9, the driving circuit 900 includes one or more bonding pads for receiving one or more gamma voltages from the external of the IC. For example, FIG. 5 illustrates K bonding pads 101_1, 101_2, . . . and 101_K used for receiving K gamma voltages VGMA_1, VGMA_2, . . . and VGMA_K from the external of the IC. The gamma resistor string 140 includes a plurality of voltage-dividing nodes V1, V2, . . . and VN to divide the gamma voltages VGMA_1~VGMA_K to N reference voltages as shown in FIG. 9. In order to be clean and simple, only the voltage-dividing nodes V1 and VN are illustrated for description, but the present invention is not limited thereto. The coupling relationship between the other voltage-dividing nodes and the DAC units 110_1~110_X may be inferred with reference to the description related to the voltage-dividing nodes V1 and VN, likewise.

The second electrostatic current limiting resistors 530_1~530_N are respectively disposed on different global paths. For example, the second electrostatic current limiting resistor 530_1 is disposed on the global path 135, while the second electrostatic current limiting resistor 530_N is disposed on another global path. First ends of the second electrostatic current limiting resistors 530_5~130_N are respectively coupled to the voltage-dividing nodes V1~VN corresponding thereto. For example, as shown in FIG. 9, the first end of the second electrostatic current limiting resistor 530_1 is coupled to the voltage-dividing node V1 of the gamma resistor string 140, and likewise, the first end of the second electrostatic current limiting resistor 530_N is coupled to the voltage-dividing node VN of the gamma resistor string 140.

The second ends of the second electrostatic current limiting resistors 530_1_530_N are respectively coupled to the first ends of the corresponding first electrostatic current limiting resistors. For example, the first end of each of the first electrostatic current limiting resistors 120_1_1, 120_1_2, . . . and 120_1_Y is commonly coupled to the second end of the second electrostatic current limiting resistor 530_1. Likewise, the first end of each of the first electrostatic current limiting resistors 120_N_1, 120_N_2, . . . and 120_N_Y is commonly coupled to the second end of the second electrostatic current limiting resistor 530_N.

Each of the digital-to-analog converters in one of the DAC units 210_1~210_Y has N reference voltage input terminals P1, P2, . . . and PN-1 and PN for receiving different reference voltages. The input terminals P1~PN are respectively coupled to the second ends of the corresponding first electrostatic current limiting resistors to receive reference voltages of different levels. For example, the input terminal P1 of each of the digital-to-analog converters in the DAC unit 210_1 is commonly coupled to the second end of the first electrostatic current limiting resistor 120_1_1 for receiving the reference voltage of the voltage-dividing node V1. Likewise, the input terminal PN of each of the digital-to-analog converters in the DAC unit 210_1 is commonly coupled to the second end of the first electrostatic current limiting resistor 120_N_1 for receiving the reference voltage of the voltage-dividing node voltage-dividing node VN. Further, the input terminal P1 of each of the digital-to-analog converters in the DAC unit 210_Y is commonly coupled to the second end of the first electrostatic current limiting resistor 120_1_Y for receiving the reference voltage of the voltage-dividing node V1. Likewise, the input terminal PN of each of the digital-to-analog converters in the DAC unit 210_Y is commonly coupled to the second end of the first electrostatic current limiting resistor 120_N_Y for receiving the reference voltage of the voltage-dividing node VN. The coupling manner of the other DAC units (such as 210_2) may be inferred with reference to the related description of the DAC units 210_1 and 210_Y in the above and will no longer repeated hereinafter. Therefore, the DAC units receive the reference voltages of the voltage-dividing nodes V1~VN through the first electrostatic current limiting resistors 120_1_1~120_1_Y, and 120_N_1~120_N_Y, respectively.

The output-stage circuit 150 is coupled to the DAC units 210_1~210_Y. The DAC units 210_1~210_Y output driving voltages to the display panel 160 through the output-stage circuit 150 so as to drive different data lines of the display panel 160.

Figure 10:
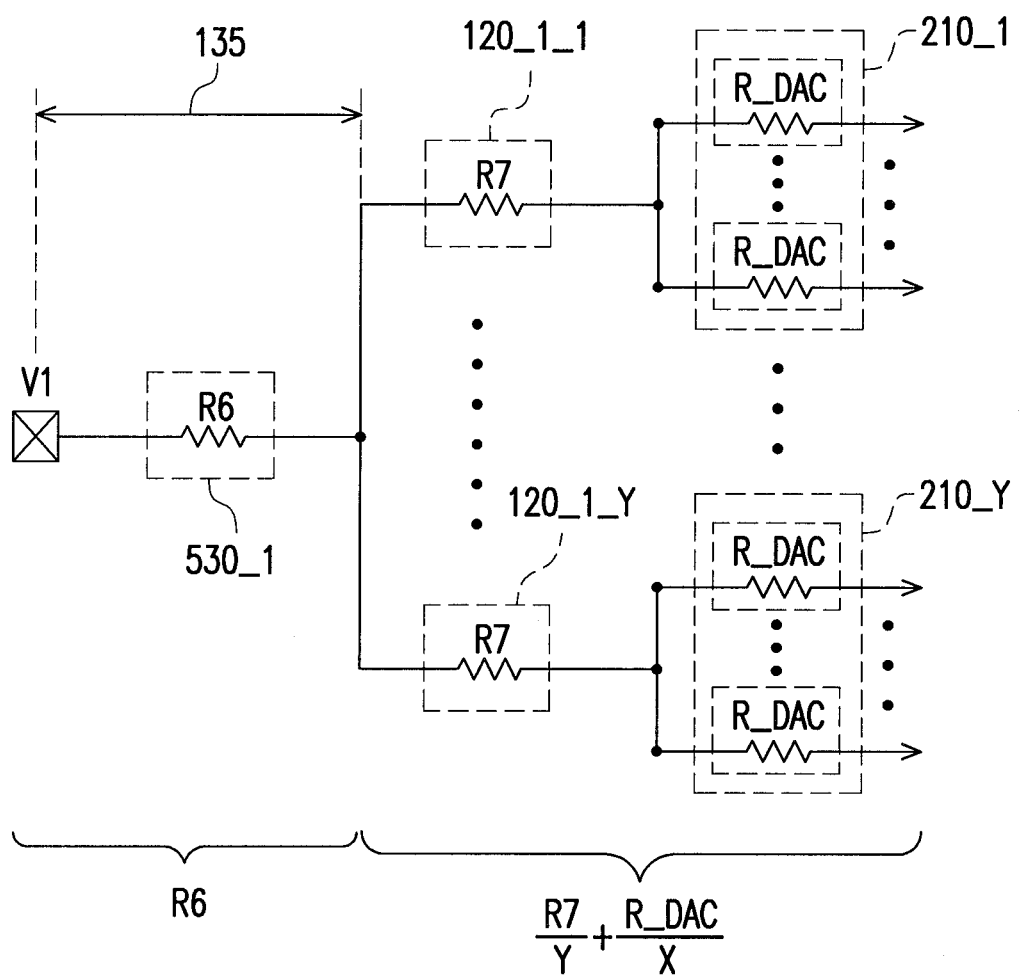
FIG. 10 is a schematic diagram illustrating a part of an equivalent circuit of the driving circuit 900 depicted in FIG. 9 according to the fourth embodiment.

FIG. 10 is a schematic diagram illustrating a part of an equivalent circuit of the driving circuit 900 depicted in FIG. 9 according to the fourth embodiment. Referring to FIG. 10 with FIG. 9, each of the DAC units 210_1~210_Y is a digital-to-analog converter group composed of X/Y digital-to-analog converters, and the X/Y digital-to-analog converters have the same resistance value. Here, it is assumed that an input impedance of the input terminal P1~PN of each of the digital-to-analog converters is R_DAC. Thus, the input impedance of each of the DAC units (e.g. 210_1 or 210_Y) is R_DAC*Y/X. Further, it is assumed that the second electrostatic current limiting resistor 530_1 has a resistance value of R6, and each of the first electrostatic current limiting resistors 120_1_1~120_1_Y has a resistance value of R7, wherein the resistance value R7 is greater than the resistance value R6, while the resistance value may be as small as possible. As such, a total equivalent resistance value R obtained between the voltage-dividing nodes V1 and the output-stage circuit 150 is R6+R_DAC/X+R7/Y. Comparing with the total equivalent resistance value R_DAC/X+R2 in the embodiment illustrated in FIG. 1, if it is assumed that (R6+R7)=R2, the total equivalent resistance value R of the present embodiment may be effectively reduced. Thus, without reducing the electrostatic discharge protection capability, the total equivalent resistance value of the of the first electrostatic current limiting resistors 120_1_1~120_1_X and the second electrostatic current limiting resistor 530_1 in the present embodiment may be reduced so as to reduce the equivalent time constant τ (τ=R*C), wherein C represents the equivalent capacitance of the circuit, which results in a faster state conversion output of the driving circuit.

In light of the foregoing, different designs of the driving circuit are adopted by the electrostatic current limiting resistors in the embodiments of the present invention to not only achieve the electrostatic protection but also reduce the equivalent time constant of the driving circuit so as to prevent the time for the driving circuit to output the state conversion from being abnormally slow.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A driving circuit, comprising:
   a second electrostatic current limiting resistor, wherein the second electrostatic current limiting resistor is coupled to first ends of a plurality of first electrostatic current limiting resistors;
   the first electrostatic current limiting resistors, wherein one of the first ends of the first electrostatic current limiting resistors is commonly coupled to the second electrostatic current limiting resistor so as to receive a reference voltage; and
   a plurality of digital-to-analog converter (DAC) units, wherein the DAC units are respectively coupled to second ends of the first electrostatic current limiting resistors in a one-on-one manner so as to respectively receive the reference voltage through the first electrostatic current limiting resistors,
   wherein the second electrostatic current limiting resistor has a resistance value smaller than the resistance value of the first electrostatic current limiting resistors.

2. The driving circuit according to claim 1, wherein each of the DAC units is a digital-to-analog converter.

3. The driving circuit according to claim 2, wherein the digital-to-analog converters have the same resistance value.

4. The driving circuit according to claim 1, wherein each of the DAC units is a digital-to-analog converter group comprising a plurality of digital-to-analog converters, and the digital-to-analog converters belonging to the same digital-to-analog converter group are commonly coupled to a second end of one electrostatic current limiting resistor among the first electrostatic current limiting resistors.

5. The driving circuit according to claim 4, wherein the digital-to-analog converter groups have the same resistance value.

6. The driving circuit according to claim 1, wherein the first electrostatic current limiting resistors have the same resistance value.

7. The driving circuit according to claim 1, further comprising:
   a gamma resistor string, having a plurality of voltage-dividing nodes to divide at least one gamma voltage to a plurality of reference voltages, wherein one of the voltage-dividing nodes is coupled to the first ends of the first electrostatic current limiting resistors through the second electrostatic current limiting resistor.

8. The driving circuit according to claim 7, further comprising:
   a bonding pad, wherein the bonding pad and the first ends of the first electrostatic current limiting resistors are commonly coupled to the one of the voltage-dividing nodes.

9. The driving circuit according to claim 1, further comprising:
   an output-stage circuit, coupled to output terminals of the DAC units, wherein the DAC units drive a display panel through the output-stage circuit.

* * * * *